US011096295B2

(12) United States Patent
Kim

(10) Patent No.: US 11,096,295 B2
(45) Date of Patent: Aug. 17, 2021

(54) ELECTRIC CONTROL UNIT

(71) Applicant: MANDO CORPORATION, Gyeonggi-do (KR)

(72) Inventor: Ji Hwan Kim, Gyeonggi-do (KR)

(73) Assignee: MANDO CORPORATION, Gyeonggi-Do (KR)

(*) Notice: Subject to any disclaimer, the term of this patent is extended or adjusted under 35 U.S.C. 154(b) by 0 days.

(21) Appl. No.: 16/546,275

(22) Filed: Aug. 20, 2019

(65) Prior Publication Data
US 2020/0068729 A1 Feb. 27, 2020

(30) Foreign Application Priority Data
Aug. 27, 2018 (KR) .................. 10-2018-0100158

(51) Int. Cl.
*H05K 5/00* (2006.01)
*H05K 1/02* (2006.01)

(52) U.S. Cl.
CPC ......... *H05K 5/0056* (2013.01); *H05K 1/0284* (2013.01); *H05K 5/006* (2013.01); *H05K 2201/09063* (2013.01); *H05K 2201/2018* (2013.01)

(58) Field of Classification Search
CPC .... H05K 5/0056; H05K 5/006; H05K 1/0284; H05K 2201/09063; H05K 2201/2018; F16F 15/02
See application file for complete search history.

(56) References Cited

U.S. PATENT DOCUMENTS

| | | | |
|---|---|---|---|
| 7,471,509 B1 * | 12/2008 | Oliver ................. | G11B 25/043 312/223.2 |
| 9,768,558 B1 * | 9/2017 | Pickel ................ | H01R 13/6587 |
| 10,524,551 B2 * | 1/2020 | Roberts ............... | H05K 5/0086 |
| 2003/0174464 A1 * | 9/2003 | Funawatari ........... | G11B 33/08 361/679.36 |
| 2007/0014045 A1 * | 1/2007 | Kim ..................... | G11B 33/025 360/97.19 |
| 2007/0085250 A1 * | 4/2007 | Chang .................... | F16F 1/373 267/141.3 |
| 2009/0122505 A1 * | 5/2009 | Lu ......................... | H05K 1/0271 361/809 |
| 2011/0143558 A1 * | 6/2011 | Kuo ................... | H01R 13/5833 439/55 |
| 2017/0002885 A1 * | 1/2017 | Mueller ................ | F16F 15/073 |

* cited by examiner

*Primary Examiner* — Hung S. Bui
*Assistant Examiner* — Sagar Shrestha
(74) *Attorney, Agent, or Firm* — Ladas & Parry, LLP

(57) ABSTRACT

These embodiments relates to an electric control unit including a circuit board that is provided in a housing, a damper including a frame member that is formed in correspondence with a frame of the circuit board and is combined with an upper face of the circuit board and a damping member combined with an upper face of the frame member, and a housing cover that is supported at the damping member and is combined with the housing and prevent generation of noise due to vibrations of the housing cover.

8 Claims, 9 Drawing Sheets

ELECTRIC CONTROL UNIT

CROSS-REFERENCE TO RELATED APPLICATION

This application claims priority from Korean Patent Application No. 10-2018-0100158, filed on Aug. 27, 2018, which is hereby incorporated by reference for all purposes as if fully set forth herein.

BACKGROUND OF THE INVENTION

Field of the Invention

These embodiments relate to an electric control unit, and more particularly, to an electric control unit reducing noise by including a damper on the inside thereof so as to absorb vibrations of a housing cover of the electric control unit installed to a vehicle.

Description of Related Art

An electric control unit that electrically controls various devices is included in a vehicle and performs a control function for being provided with information from a sensor, a switch, or the like installed in the vehicle and improving safety, a steering sense, and the like of the vehicle by processing the provided information.

Such an electric control unit includes a circuit board, a housing that supports a lower side of the circuit board, and a housing cover that is combined with the housing from the upper side while enclosing the circuit board. The housing and the housing cover are combined through a clinching method, screw fastening, or the like.

However, in a conventional electric control unit, in a case in which a housing cover is combined using the clinching method, a part of a housing cover is combined with a lower side of a housing while plastic deformation thereof is performed. However, there is a problem in that housing cover is not uniformly bonded to the housing due to incomplete clinching, a defect such as a low degree of combination or the like occurs, and noise according to a vibration of the housing cover occurs.

In addition, in a case in which a housing cover is screw-fastened, there is a problem in that water leakage occurs at a screw-fastened portion, and the electric control unit may be broken.

SUMMARY OF THE INVENTION

These embodiments are proposed from the background described above, and an object thereof is to reduce noise by including a damper inside an electric control unit so as to absorb vibrations of a housing cover of the electric control unit installed in a vehicle.

The object of these embodiments is not limited thereto, and other objects not described here can be clearly understood by a person skilled in the art from the following description.

According to these embodiments, an electric control unit including a circuit board that is provided in a housing, a damper including a frame member that is formed in correspondence with a frame of the circuit board and is combined with an upper face of the circuit board and a damping member combined with an upper face of the frame member, and a housing cover that is supported at the damping member and is combined with the housing can be provided.

According to these embodiments, noise can be reduced by including a damper inside an electric control unit so as to absorb vibrations of a housing cover of the electric control unit installed in a vehicle.

DETAILED DESCRIPTION OF THE INVENTION

Figure 1:
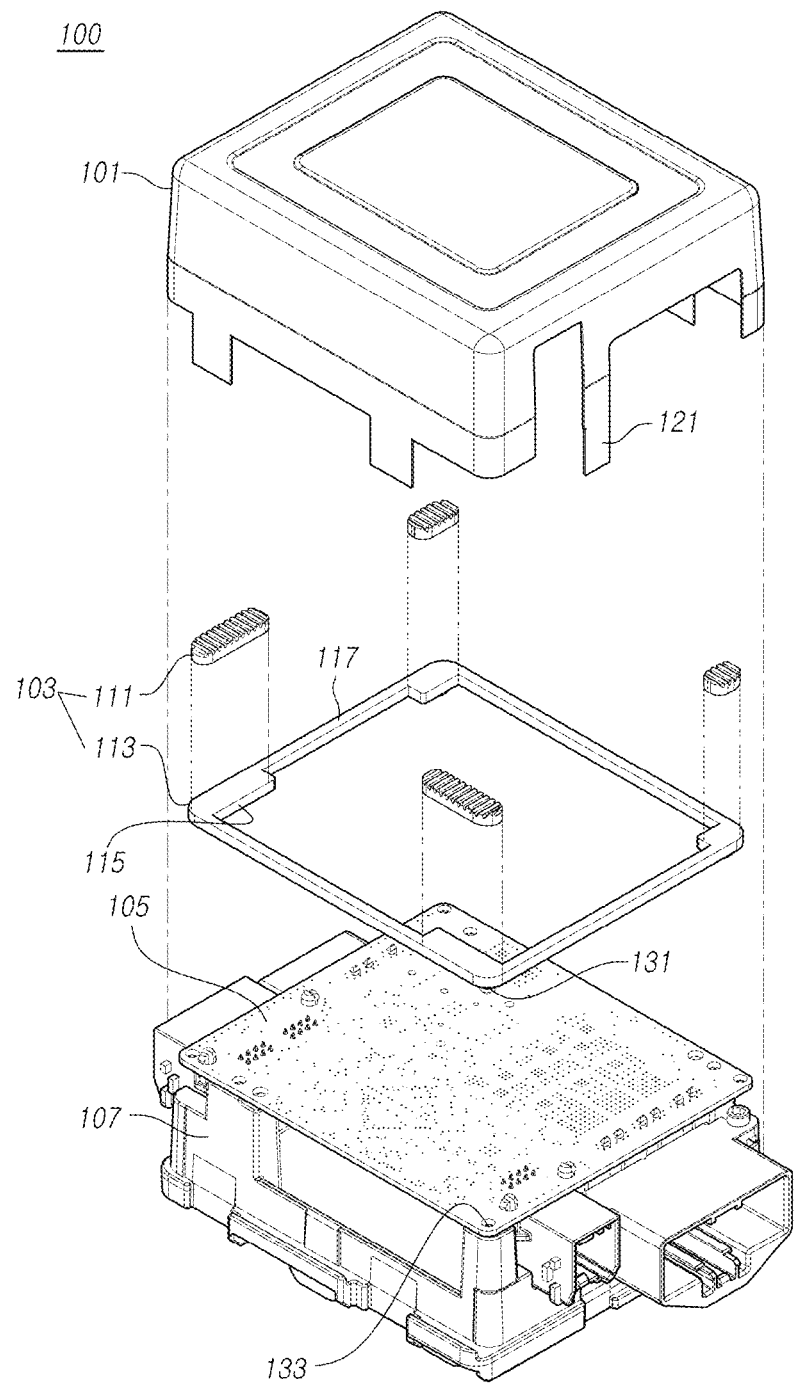
FIGS. 1 and 2 are exploded perspective views of an electric control unit according to these embodiments.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Figure 2:
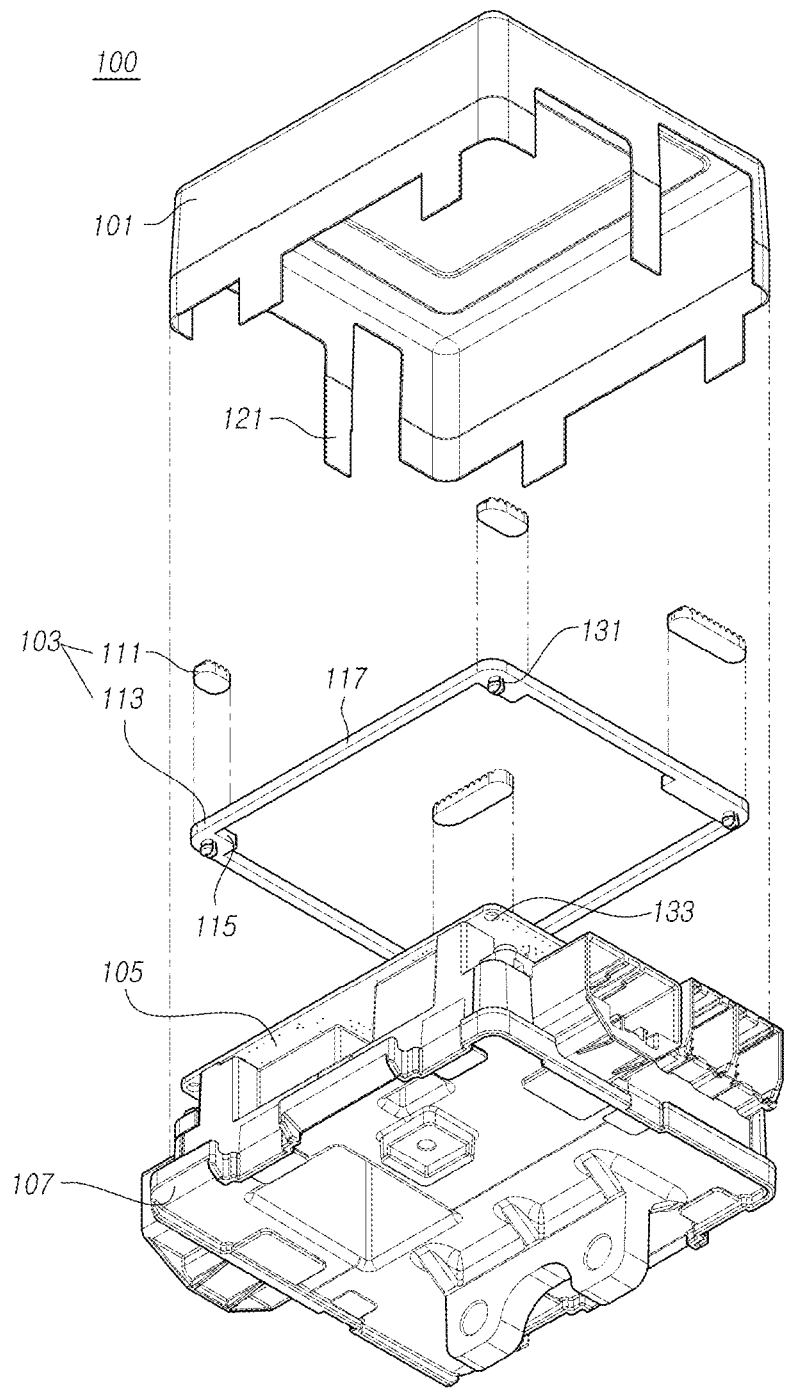
Figure 3:
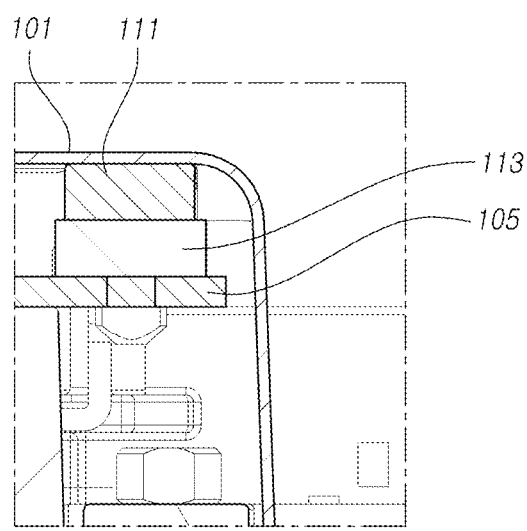
FIG. 3 is a perspective view of a part of a combined state illustrated in FIG. 1.
Figure 4:
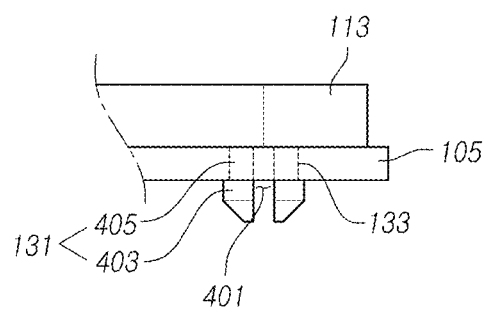
FIG. 4 is a cross-sectional view of a part of FIG. 1.
Figure 5:
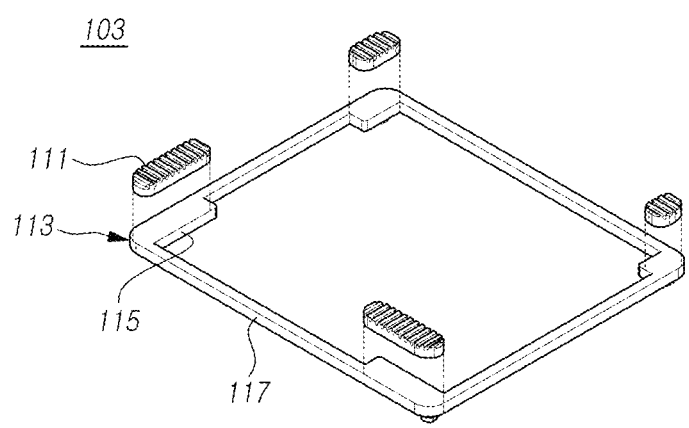
FIGS. 5 and 6 are perspective views of parts of electric control units according to these embodiments.
Figure 6:
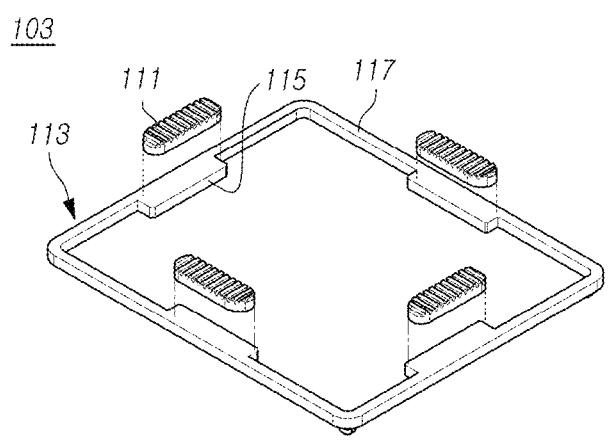
Figure 7:
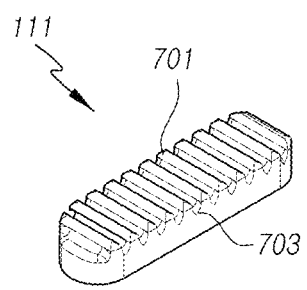
FIGS. 7 to 9 are perspective views of parts of electric control units according to these embodiments.
Figure 8:
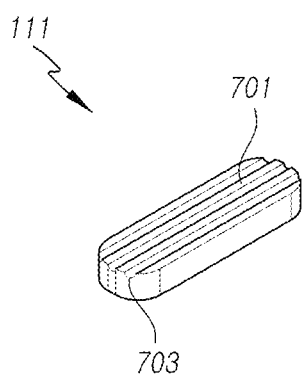
Figure 9:
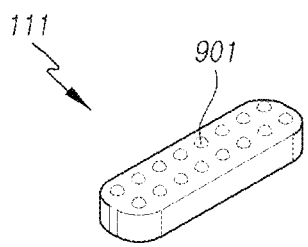

FIGS. 1 and 2 are exploded perspective views of an electric control unit according to these embodiments, FIG. 3 is a perspective view of a part of a combined state illustrated in FIG. 1, FIG. 4 is a cross-sectional view of a part of FIG. 1, FIGS. 5 and 6 are perspective views of parts of electric control units according to these embodiments, and FIGS. 7 to 9 are perspective views of parts of electric control units according to these embodiments.

Referring to FIGS. 1 and 2, an electric control unit 100 according to these embodiments includes a circuit board 105 that is provided in a housing 107, a damper 103 including a frame member 113 that is formed in correspondence with a frame of the circuit board 105 and is combined with an upper face of the circuit board 105 and a damping member 111 combined with an upper face of the frame member 113, and a housing cover 101 that is supported at the damping member 111 and is combined with the housing 107 can be provided.

The circuit board 105 is combined with the housing 107 and is provided with various kinds of information of the vehicle and processes the provided information.

In order to protect such a circuit board 105, the housing cover 101 is combined with the housing 107. The housing cover 101 is formed such that an empty space is formed on the inside thereof, and a lower side is open, and the circuit board 105 is positioned on the inner side of the housing cover 101 if the housing cover 101 is combined with the housing 107.

In other words, the circuit board 105 is supported at the housing 107, and, when the housing cover 101 is combined, an upper face of the circuit board 105 and an inner-side face of the housing cover 101 are adjacently positioned.

A plurality of extending parts 121 formed to extend to the lower side are provided at a lower end of the housing cover 101, and the extending parts 121 are supported at the lower side of the housing 107 while being plastic deformed to bend to the inner side, whereby the housing cover 101 is combined with the housing 107.

At this time, dampers 103 are provided between the circuit board 105 and the housing cover 101, and the dampers 103 reduce noise by absorbing vibrations of the housing cover 101.

In other words, in a case in which combination with the housing cover 101 is defective like a case in which a gap is generated between the extending parts 121 and the lower side of the housing 107 due to incomplete plastic deformation of the extending parts 121, vibrations of the housing cover 101 may occur. In such a case, the dampers 103 absorb the vibrations of the housing cover 101, and the generation of noise is prevented.

Each of the dampers 103 includes a frame member 113 and a damping member 111. The frame members 113 are formed in correspondence with the frame of the circuit board 105 and are combined with an upper face of the circuit board 105, and the damping members 111 are combined with upper faces of the frame members 113 and are supported at the housing cover 101 combined with the housing 107.

In other words, the frame members 113 have an empty space formed at the center so as not to interfere with a circuit printed in the circuit board 105, installed components, and the like and are combined with the frame of the circuit board 105.

As one example, in a case in which the circuit board 105 is formed in a rectangular shape as illustrated in FIG. 1, the frame members 113 may be formed in a rectangular frame shape such that the frame members are combined with the frame of the circuit board 105.

The frame member 113 may be formed using an engineering plastic-based material such as polyacetal (POM), polyamide (PA), polycarbonate (PC), polyimide (PI), or polybutylene terephthalate, or the like.

Referring to FIG. 3, the damping members 111 are combined with the frame members 113, and the upper faces thereof are supported at an inner-side face of the housing cover 101.

In order to perform a damping action for absorbing noise and vibrations, the damping member 111 is composed of an elastic material such as natural rubber (NR), nitrile butadiene rubber (NBR), chloroprene rubber (CR), ethylene propylene terpolymer (EPDM), fluoro elastomer (FPM), styrene butadiene rubber (SBR), chlorosulphonated polyethylene (CSM), silicon, or urethane.

Such damping members 111 may be separately injected and provided in the frame members 113 or may be integrally injected and molded together with the frame members 113.

Referring to FIG. 4, the circuit board 105 includes a combination hole 133 that vertically passes through the circuit board 105, and the frame member 113 includes a combination part 131 that is formed to protrude from a lower-side face of the fame member 113 and is inserted into the combination hole 133, and the dampers 103 are combined with the circuit board 105.

In addition, two or more combination holes 133 are provided with being separate away from each other, and combination parts 131 are provided at positions corresponding to the combination holes 133, and accordingly, the frame member 113 combined with the circuit board 105 can be fixed without being rotated.

The combination part 131 includes a small-diameter part 405 supported at an inner circumferential face of the combination hole 133 and a large-diameter part 403 that is formed with a diameter larger than that of the small-diameter part 405 and protrudes from the combination hole 133 to the lower side, and accordingly, the damper 103 can be fixed to the circuit board 105 in a vertical direction and an axial direction.

In other words, the small-diameter part 405 is supported at the inner circumferential face of the combination hole 133, and accordingly, the damper 103 is fixed in the axial direction. In addition, the damper is fixed in the vertical direction by the large-diameter part 403 that protrudes to the lower side of the combination hole 133 and is supported at the lower face of the circuit board 105.

Such a combination part 131 includes an incision part 401 that divides the small-diameter part 405 and the large-diameter part 403. The combination part 131 can be inserted into the combination hole 133, in other words, the incision part 401 is narrowed, and the large-diameter part 403 is inserted into the combination hole 133, and, after the large-diameter part 403 protrudes to the lower side, the incision part 401 is widened in accordance with an elastic force, and the damper 103 and the circuit board 105 are combined.

In addition, a lower end of the large-diameter part 403 may be formed to be tapered, the incision part 401 is narrowed in accordance with a force pressing the frame member 113 to the lower side, and the combination part 131 is inserted into the combination hole 133, and accordingly, the damper 103 and the circuit board 105 can be easily combined without requiring an additional process.

Referring to FIGS. 5 and 6, the frame member 113 may include two or more mount parts 115 with which the damping members 111 are combined and a connecting part 117 connecting the mount parts 115.

In other words, two or more mount parts 115 may be provided and arranged to be separate from each other, and such mount parts 115 are connected using the connecting part 117.

In addition, the mount part 115 may be formed to have a width larger than that of the connecting part 117. In such a case, the damping member 111 combined with the mount part 115 is provided to have a larger width in accordance therewith, and accordingly, an area supported at the housing cover 101 becomes large, whereby the damping performance can be improved.

In the drawings, although an embodiment in which the mount part 115 extends to the inner side and has a width larger than that of the connecting part 117 is illustrated, the mount part may be formed to extend to the outer side or the outer and inner sides. In addition, the mount parts 115 are arranged at positions opposing each other with reference to the center of the frame member 113, and the damping members 111 combined with the mount parts 115 support the housing cover 101 in a balanced manner and can reduce noise.

Although the damping members 111 may be provided on the entire upper face of the frame member 113, it is preferable that the damping members 111 are provided in only a part of the top face instead of the entire upper face of the frame member 113.

As an example, in a case in which the frame member 113 is formed in a rectangular shape, the mount parts 115 may be arranged at corresponding vertexes as illustrated in FIG. 5 or may be arranged on corresponding sides as illustrated in FIG. 6. Alternatively, although not illustrated in the drawing, as a combination thereof, the mount parts may be provided at corresponding vertexes and on corresponding sides.

In other words, by providing a plurality of damping members 111 to be separate in the frame member 113, the housing cover 101 can be uniformly supported.

In other words, in a case in which some of the extending parts 121 are incompletely combined, and vibrations are generated, a plurality of damping members 111 are provided in the frame member 113 and are supported at several points of the housing cover 101, whereby the damping performance is improved, and generation of noise is prevented.

Meanwhile, the housing cover 101 can be combined with the housing 107 while pressing the damping members 111. Thus, after the housing cover 101 is combined with the housing 107, the damping members 111 are supported at the housing cover 101 in a compressed state, and accordingly, a gap is not generated between the housing cover 101 and the damping members 111.

At this time, the damping member 111 may include peak parts 701 and trough parts 703 formed on the upper face of the damping member 111 or may include a plurality of protrusions 901 formed on the upper face of the damping member 111.

By forming the peak parts 701 and the trough parts 703 or the protrusions 801, when the housing cover 101 is combined while pressing the damping member 111, the amount of compression of the damping member 111 decreases, and damage thereof can be prevented.

The peak parts 701 and the trough parts 703 may be formed in various directions and shapes and, for example, as illustrated in FIGS. 7 and 8, may be formed in a widthwise direction or a longitudinal direction of the damping member 111 such that the cross-section is continuously bent. Alternatively, although not illustrated in the drawing, the cross-section may be formed to have multiple angles such as a triangle.

For example, as illustrated in FIG. 9, the protrusions 901 may be formed in semi-spherical shapes and be evenly distributed on the surface of the damping member 111.

According to an electric control unit having such a shape, even if the housing cover is incompletely combined with the housing, the housing cover is supported by the dampers, and vibrations are absorbed, whereby noise is reduced.

In addition, the combination holes are provided on the circuit board, the combination parts are provided in the frame member, the small-diameter part and the large-diameter part are provided in the combination part, the damper is fixed to the circuit board in a vertical direction and a lateral direction, the incision part is provided in the combination part, and the large-diameter part is formed to be tapered, and accordingly, the damper can be easily combined with the circuit board without requiring any additional process.

In addition, the frame member includes the mount parts with which the damping members are combined and the connecting part connecting the mount parts, the mount parts are formed to have a width larger than that of the connecting part, and an area in which the damping members are supported at the housing cover becomes large, whereby the damping performance can be improved.

In addition, the damping members are not provided in the entire frame member but are provided only in a part thereof, and the manufacturing cost and the weight are reduced, and the mount parts and the damping members are arranged at positions facing each other with reference to the center of the frame member, whereby the damping performance can be improved.

In addition, the housing cover is combined with the housing while pressing the damping member, and a gap is not generated between the housing cover and the damping members, and the damping member includes peak parts and trough parts or a plurality of protrusions, and accordingly, the amount of compression of the damping member decreases, and damage in the damping member is prevented.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

REFERENCE SIGNS LIST

100: Electric control unit
101: Housing cover

103: Damper
105: Circuit board
107: Housing
111: Damping member
113: Frame member
115: Mount part
117: Connecting part
121: Extending part
131: Combination part
133: Combination hole
401: Incision part
403: Large-diameter part
405: Small-diameter part
701: Peak part
703: Trough part
901: Protrusion

What is claimed is:

1. An electric control unit comprising:
a circuit board that is provided in a housing;
a damper including: a frame member that is formed in correspondence with a frame of the circuit board, the frame member contacting an upper face of the circuit board, and a damping member spaced apart from an upper face of the circuit board so that the frame member is disposed between the circuit board and the damping member; and
a housing cover that is supported at the damping member and is combined with the housing,
wherein the damping member includes a plurality of peak parts and trough parts formed on an upper face of the damping member,
wherein the circuit board includes a combination hole vertically passing through the circuit board, and the frame member includes a combination part that is formed to protrude from a lower face of the frame member and is inserted into the combination hole, and
wherein the combination part includes a small-diameter part supported on an inner circumferential face of the combination hole and a large-diameter part protruding from the combination hole to a lower side.

2. The electric control unit according to claim 1, wherein two or more combination holes are provided with being separated from each other, and the combination parts are provided at positions corresponding to the combination holes.

3. The electric control unit according to claim 1, wherein the combination part includes an incision part that divides the small-diameter part and the large-diameter part.

4. The electric control unit according to claim 3, wherein the large-diameter part is formed to have a tapered lower end.

5. The electric control unit according to claim 1, wherein the frame member includes two or more mount parts with which the damping member is combined and a connecting part connecting the mount parts.

6. The electric control unit according to claim 5, wherein the mount parts are formed to have a width larger than that of the connecting part.

7. The electric control unit according to claim 5, wherein the mount parts are arranged at positions facing each other with reference to the center of the frame member.

8. An electric control unit comprising:
a circuit board that is provided in a housing;
a damper including: a frame member that is formed in correspondence with a frame of the circuit board, the frame member contacting an upper face of the circuit board, and a damping member spaced apart from an upper face of the circuit board so that the frame member is disposed between the circuit board and the damping member; and
a housing cover that is supported at the damping member and is combined with the housing,
wherein the damping member includes a plurality of protrusions formed on an upper face of the damping member,
wherein the circuit board includes a combination hole vertically passing through the circuit board, and the frame member includes a combination part that is formed to protrude from a lower face of the frame member and is inserted into the combination hole, and
wherein the combination part includes a small-diameter part supported on an inner circumferential face of the combination hole and a large-diameter part protruding from the combination hole to a lower side.

\* \* \* \* \*